(12) United States Patent
Lee et al.

(10) Patent No.: US 7,208,824 B2
(45) Date of Patent: Apr. 24, 2007

(54) LAND GRID ARRAY MODULE

(75) Inventors: Young-Min Lee, Yongin-si (KR);
Kyu-Sub Kwak, Seoul (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 58 days.

(21) Appl. No.: 11/100,151

(22) Filed: Apr. 6, 2005

(65) Prior Publication Data

US 2006/0091543 A1    May 4, 2006

(30) Foreign Application Priority Data

Oct. 28, 2004    (KR) .................. 10-2004-0086568

(51) Int. Cl.
*H01L 23/02* (2006.01)
(52) U.S. Cl. ............... 257/686; 257/E25.023; 257/723; 257/685; 257/777; 438/108; 438/109; 361/760
(58) Field of Classification Search ........ 257/E27.137, 257/E27.144, E27.161, E25.023, 738, 777, 257/685, 686, 723–725, 787; 438/108, 109; 361/760
See application file for complete search history.

(56) References Cited

U.S. PATENT DOCUMENTS

| | | | | |
|---|---|---|---|---|
| 5,570,274 A | * | 10/1996 | Saito et al. ............... | 361/784 |
| 5,615,089 A | * | 3/1997 | Yoneda et al. ............ | 361/764 |
| 5,795,799 A | * | 8/1998 | Hosoya .................... | 438/126 |
| 5,808,878 A | * | 9/1998 | Saito et al. ............... | 361/818 |
| 5,844,315 A | * | 12/1998 | Melton et al. ............ | 257/738 |
| 6,049,467 A | * | 4/2000 | Tamarkin et al. ......... | 361/790 |
| 6,223,429 B1 | * | 5/2001 | Kaneda et al. ............ | 29/832 |
| 6,340,839 B1 | * | 1/2002 | Hirasawa et al. ......... | 257/672 |
| 6,424,034 B1 | * | 7/2002 | Ahn et al. ................. | 257/723 |
| 6,597,062 B1 | * | 7/2003 | Li et al. ................... | 257/686 |
| 6,700,196 B1 | * | 3/2004 | Kautz et al. .............. | 257/723 |
| 6,833,628 B2 | * | 12/2004 | Brandenburg et al. .... | 257/778 |
| 6,919,620 B1 | * | 7/2005 | Miks et al. ............... | 257/666 |

* cited by examiner

*Primary Examiner*—Kenneth Parker
*Assistant Examiner*—Chris C. Chu
(74) *Attorney, Agent, or Firm*—Cha & Reiter, L.L.C.

(57) ABSTRACT

Disclosed is a land grid array module comprising: a substrate; a plurality of active and passive components mounted on both sides of the substrate; and a molding compound for encapsulating the both sides of the substrate with the active and passive components mounted thereon. The land grid array module mounts the passive and active components on both sides of the substrate, thereby improving the integration of the circuit device. Also, the use of a thin film printed circuit board or a flexible printed circuit board with high rigidity as the substrate reduces the overall thickness of the land grid array module.

9 Claims, 1 Drawing Sheet

LAND GRID ARRAY MODULE

CLAIM OF PRIORITY

This application claims priority to an application entitled "Land Grid Array Module," filed with the Korean Intellectual Property Office on Oct. 28, 2004 and assigned Serial No. 2004-86568, the contents of which are hereby incorporated by reference.

BACKGROUND OF THE INVENTION

1. Field of the Invention

The present invention relates to a semiconductor device having a ball grid array ("BGA") or land grid array ("LGA") IC packaging type, and more particularly to an LGA module that can improve a circuit integration by mounting multiple components on both sides of a substrate.

2. Description of the Related Art

An integration of high density semiconductor ICs has played an important role in the development of electronic devices in recent years. For example, mobile phones have been evolved, in addition to basic communication and messaging services, to provide a variety of multimedia services, such as mobile games, data transmission, digital cameras, MP3 players and reproduction of moving image file. To meet the ever-increasing demand for smaller, lighter and thinner mobile phones capable of higher performance in multimedia services, higher integration of circuit devices is needed.

Techniques for improving the integration of circuit devices include BGA and LGA. BGA packages utilize an array of solder balls to bond a semiconductor IC chip to a substrate. The solder balls serve as input/output channels of the semiconductor chip. By contrast, LGA provides solder pads as input/output channels on a substrate without fusing solder balls.

Conventional semiconductor packaging techniques, however, have a limitation in meeting the need for higher circuit integration because a semiconductor integrated circuit is mounted on one side of a substrate.

SUMMARY OF THE INVENTION

Accordingly, the present invention has been made to solve the above-mentioned problems occurring in the prior art and provides additional advantages, by providing a land grid array module for achieving higher integration of a circuit device in a semiconductor IC package.

In one embodiment, there is provided a land grid array module comprising: a substrate; a plurality of active and passive components mounted on both sides of the substrate; and a molding compound for encapsulating both sides of the substrate with active and passive components mounted thereon.

BRIEF DESCRIPTION OF THE DRAWINGS

The above features and advantages of the present invention will be more apparent from the following detailed description taken in conjunction with the accompanying drawing, in which.

DETAILED DESCRIPTION

Figure 1:
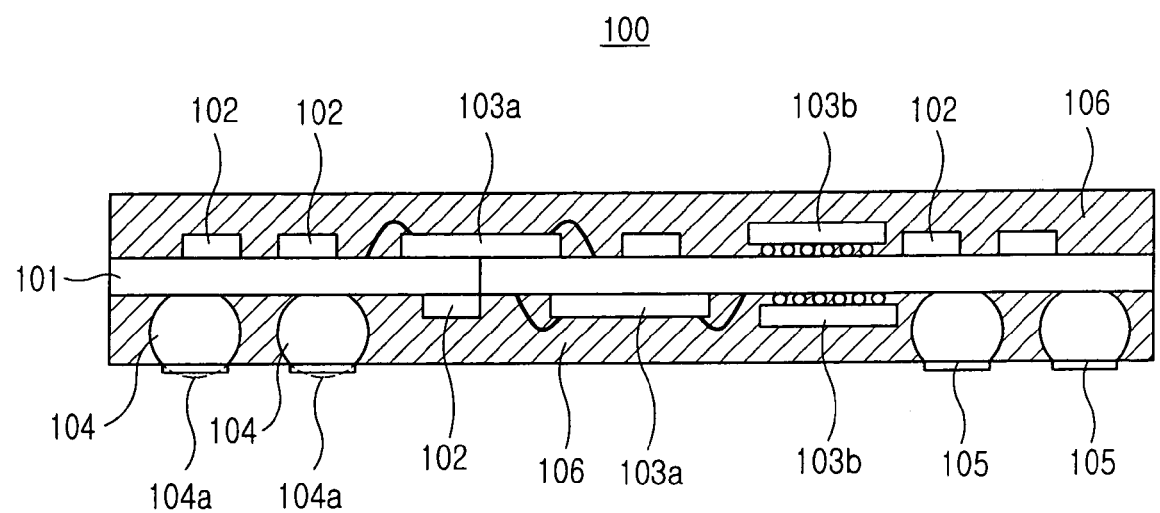
FIG. 1 is a view showing the structure of a land grid array module according to the present invention.

Hereinafter, an embodiment of the present invention will be described with reference to the accompanying drawings. For the purposes of clarity and simplicity, a detailed description of known functions and configurations incorporated herein will be omitted as it may make the subject matter of the present invention unclear.

FIG. 1 shows a land grid array module 100 according to the embodiment of the present invention. As shown, the land grid array module 100 includes a substrate 101, a plurality of passive components 102, a plurality of active components 103a and 103b, a plurality of solder balls 104 and 105, and a molding compound 106.

The passive and active components 102, 103a and 103b are mounted on top and bottom sides of the substrate 101. Also, a circuit pattern (not shown) for forming input/output channels of the passive and active components 102, 103a and 103b are printed on the top and bottom sides of the substrate 101. The substrate 101 can be any of the conventional printed circuit boards. In the present invention, a thin film printed circuit board or a flexible printed circuit board with high rigidity is preferable for providing a smaller and thinner land grid array module.

When both sides of the substrate 101 with the passive and active components 102, 103a and 103b mounted thereon are encapsulated with the molding compound 106, the mechanical and physical rigidity of the substrate 101 can be increased. Therefore, a flexible printed circuit board can be used as the substrate 101.

The passive and active components 102, 103a and 103b are appropriately disposed on the top and bottom sides of the substrate 101. The active components 103a and 103b are mounted on the substrate 101 by wire bonding or flip-chip bonding. Note that this type of bonding methods are obvious to those skilled in the art.

The plurality of solder balls 104 and 105 are disposed on at least one side of the substrate 101 and coupled to one end of the signal lines forming the printed circuit pattern on the substrate 101. The signal lines of the printed circuit pattern are connected to the input/output channels of the passive and active components 102, 103a and 103b. As a result, the solder balls 104 and 105 can serve as input/output channels of the land grid array module 100.

Upon disposition of the passive and active components 102, 103a and 103b and the solder balls 104 and 105, both sides of the substrate 101 are encapsulated with the molding compound 106 such as an epoxy resin, thereby forming a protection for the passive and active components 102, 103a and 103b and the solder balls 104 and 105 and increasing the mechanical and physical rigidity of the substrate 101.

Meanwhile, the solder balls 104 and 105 are not completely encapsulated in the molding compound 106 with their lower portions 104a being exposed outside the molding compound 106. The exposed portions 4a of the solder balls 104 are planarized by a grinding process and then plated to serve as connection pads. More specifically, while larger portions of the solder balls 104 and 105 encapsulated in the molding compound 106 function as leads, the bottom portions 104a which are not encapsulated but exposed outside the molding compound 106 serving as connection pads of the land grid array module 100. In other words, the land grid array module 100 has a BGA module form inside the molding compound 106 and an LGA module form having connection pads outside the molding compound 106.

Since the passive and active components 102, 103a and 103b are mounted on both sides of the substrate 101 and then encapsulated with the molding compound 106, the overall thickness of the land grid array module 100 may be thicker than conventional modules. However, it is possible to minimize the thickness of the land grid array module 100 by using a thin film printed circuit board or a flexible printed circuit board as the substrate 101.

As explained above, the land grid array module according to the present invention mounts the passive and active components on both sides of the substrate, thereby improving the integration of the circuit device. Further, the use of a thin film printed circuit board or a flexible printed circuit board with high rigidity as the substrate can reduce the overall thickness of the land grid array module.

Although a preferred embodiment of the present invention has been described for illustrative purposes, those skilled in the art will appreciate that various modifications, additions and substitutions are possible, without departing from the scope and spirit of the invention as disclosed in the accompanying claims, including the full scope of equivalents thereof.

What is claimed is:

1. A land grid array module comprising:
   a substrate;
   a plurality of active and passive components mounted on both sides of the substrate;
   a molding compound for encapsulating the both sides of the substrate with the active and passive components mounted thereon; and
   a plurality of solder balls attached to one side of the substrate, wherein the solder balls are mostly encapsulated in the molding compound with bottom portions being exposed outside the molding compound, and the exposed portions of the solder balls are planarized by a grinding process and plated.

2. The land grid array module as claimed in claim 1, wherein the substrate is a thin film printed circuit board or a flexible printed circuit board with high rigidity.

3. The land grid array module as claimed in claim 1, wherein the active components are mounted on the substrate by wire bonding or flip-chip bonding.

4. The land grid array module as claimed in claim 1, wherein the plurality of solder balls serve as input/output channels of the land grid array module.

5. The land grid array module as claimed in claim 1, wherein the plurality of solder balls is coupled to a plurality of signal lines forming a printed circuit pattern on the substrate.

6. The land grid array module as claimed in claim 1, wherein the signal lines of the printed circuit pattern are coupled to input/output channels of the passive and active components.

7. A method for providing a land grid array module, the method comprising the steps of:
   providing a substrate;
   providing a plurality of active and passive components on both sides of the substrate;
   encapsulating the both sides of the substrate with the active and passive components mounted thereon using a molding compound;
   providing a plurality of solder balls coupled to one side of the substrate wherein the solder balls are mostly encapsulated in the molding compound with bottom portions being exposed outside the molding compound, and the exposed portions of the solder balls are planarized by a grinding process and plated.

8. The method of claim 7, wherein the substrate is a thin film printed circuit board or a flexible printed circuit board with high rigidity.

9. The method of claim 7, wherein the active components are mounted on the substrate by wire bonding or flip-chip bonding.

* * * * *